(12) United States Patent  
Mugibayashi et al.

(10) Patent No.: US 6,741,940 B2
(45) Date of Patent: May 25, 2004

(54) COMPUTER-IMPLEMENTED METHOD OF DEFECT ANALYSIS

(75) Inventors: Toshiaki Mugibayashi, Tokyo (JP); Nobuyoshi Hattori, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 94 days.

(21) Appl. No.: 10/224,469

(22) Filed: Aug. 21, 2002

(65) Prior Publication Data

US 2003/0060985 A1 Mar. 27, 2003

(30) Foreign Application Priority Data

Sep. 25, 2001 (JP) ........................................ 2001-291476

(51) Int. Cl.$^7$ .............................................. G06F 19/00
(52) U.S. Cl. ........................... 702/35; 702/84; 702/181; 700/110; 700/121
(58) Field of Search ............................. 702/35, 81, 83, 702/84, 181, 182; 700/103, 110, 116, 121; 324/765

(56) References Cited

U.S. PATENT DOCUMENTS

| | | | | |
|---|---|---|---|---|
| 5,801,965 A | * | 9/1998 | Takagi et al. | 702/35 |
| 5,946,213 A | * | 8/1999 | Steffan et al. | 700/110 |
| 5,991,699 A | * | 11/1999 | Kulkarni et al. | 702/83 |
| 6,035,244 A | * | 3/2000 | Chen et al. | 700/110 |
| 6,341,241 B1 | | 1/2002 | Mugibayashi et al. | |
| 6,473,665 B2 | | 10/2002 | Mugibayashi et al. | |

FOREIGN PATENT DOCUMENTS

JP  11-264797  9/1999

OTHER PUBLICATIONS

T. Mugibayashi, et al., "A novel quantitative analysis of defects detected by in–line monitoring", The Seventh International Symposium on Semiconductor Manufacturing (ISSM98) pp. 335–338.

* cited by examiner

Primary Examiner—Bryan Bui
(74) Attorney, Agent, or Firm—Oblon, Spivak, McClelland, Maier & Neustadt, P.C.

(57) ABSTRACT

In the step (S11), chip classification data in which a plurality of chips are classified into four sorts on the basis of presence/absence of (new) defects and pass/fail (of integrated circuits) is obtained. Next, in the step (S12) set is a situation where chips are randomly extracted out of all the chips with the number of chips with defect used as random extraction number on the basis of the chip classification data obtained in the step (S11). After that, in the step (S13) obtained is the random probability of failure (P(N4)) which is a probability that the number of faulty chips included in the randomly-extracted chips should be not less than the equivalent of the number (N4) of faulty chips with defect. Thus obtained is a defect analysis method and a method of verifying chip classification data, by which the analysis result on the basis of the chip classification data can be enhanced.

12 Claims, 17 Drawing Sheets

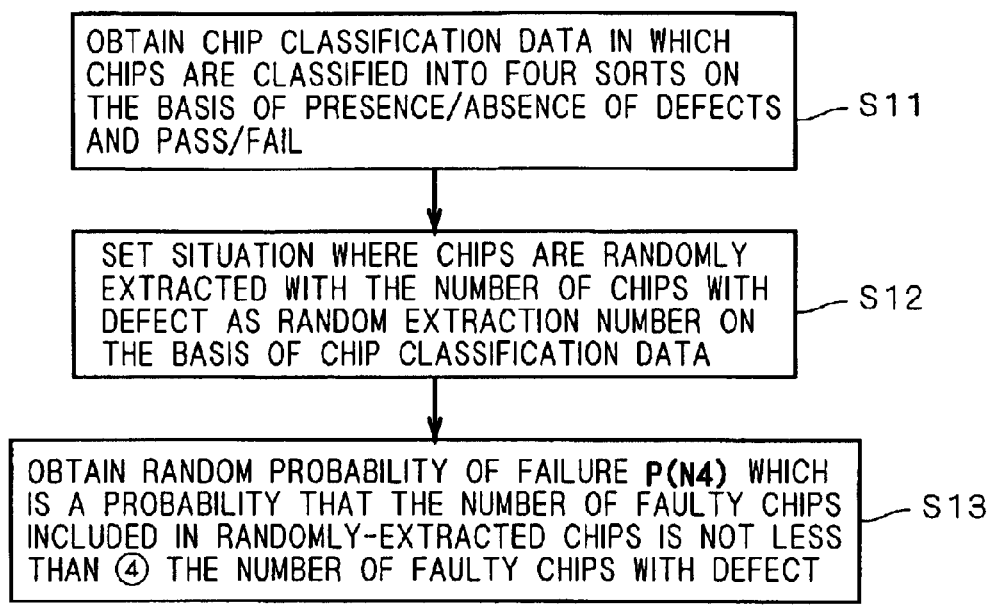
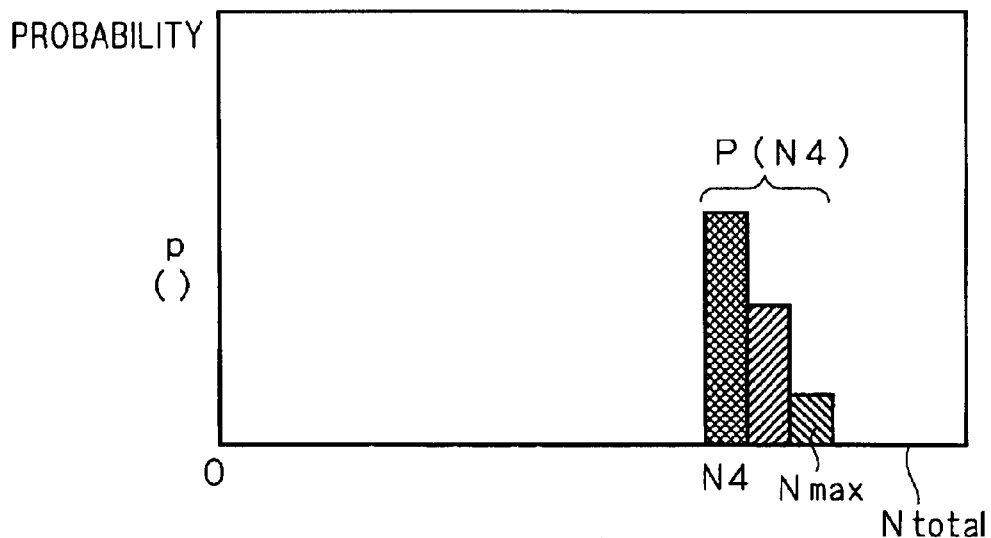

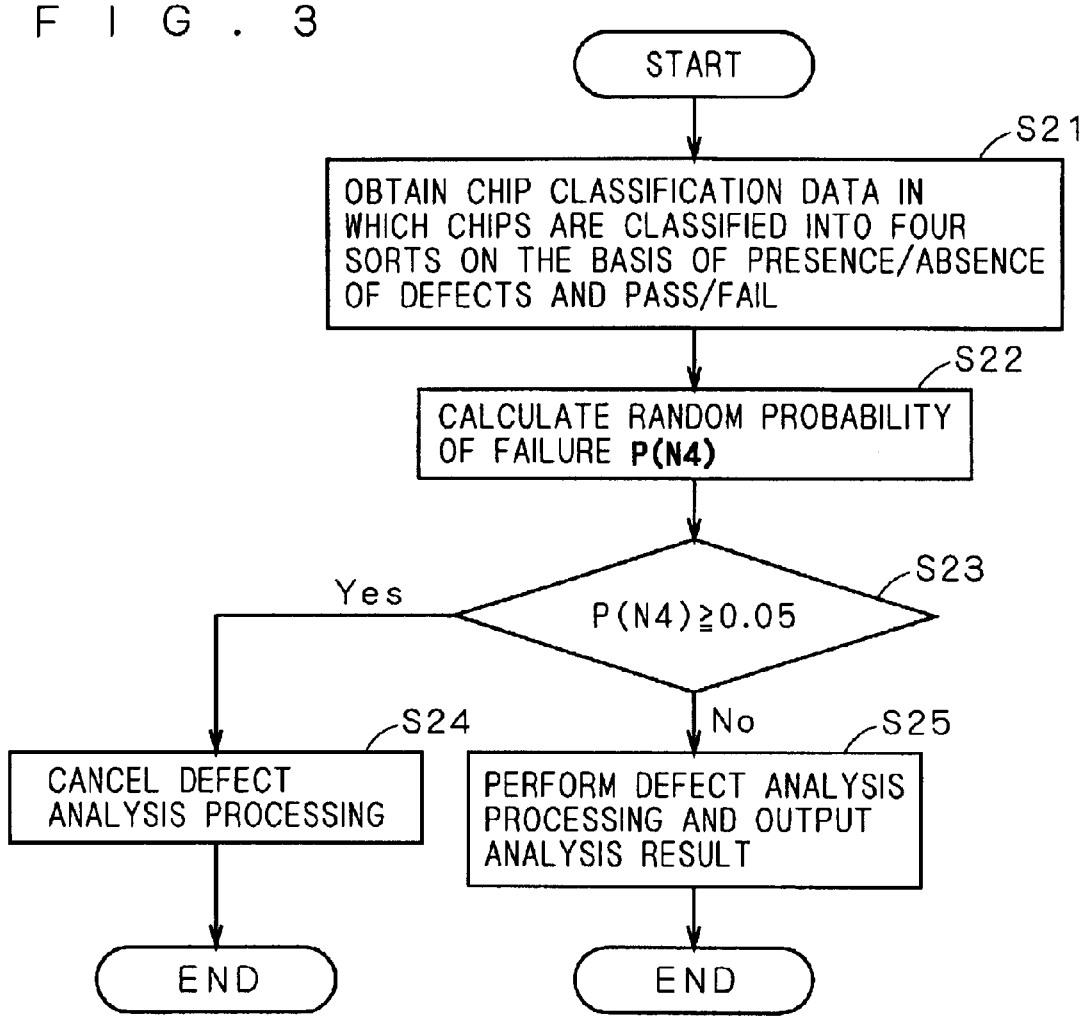

F I G. 5

| DETECTION SIZE | ALL | 0.3 μm OR MORE | 0.4 μm OR MORE | 0.5 μm OR MORE | 0.7 μm OR MORE |
|---|---|---|---|---|---|
| ① GOOD WITHOUT DEFECT | 3 | 8 | 11 | 30 | 48 |
| ② FAILURE WITHOUT DEFECT | 2 | 5 | 7 | 21 | 42 |
| ③ GOOD WITH DEFECT | 54 | 49 | 46 | 27 | 9 |
| ④ FAILURE WITH DEFECT | 76 | 73 | 71 | 57 | 36 |
| THE NUMBER OF PROCESS FAULTY CHIPS | 40.0 | 42.4 | 41.7 | 38.1 | 28.1 |
| FATALITY RATE | 0.308 | 0.347 | 0.357 | 0.454 | 0.625 |

FIG. 7

| DETECTION SIZE | ALL | 0.3 μm OR MORE | 0.4 μm OR MORE | 0.5 μm OR MORE | 0.7 μm OR MORE |
|---|---|---|---|---|---|
| ① GOOD WITHOUT DEFECT | 3 | 8 | 11 | 30 | 48 |
| ② FAILURE WITHOUT DEFECT | 2 | 5 | 7 | 21 | 42 |
| ③ GOOD WITH DEFECT | 54 | 49 | 46 | 27 | 9 |
| ④ FAILURE WITH DEFECT | 76 | 73 | 71 | 57 | 36 |
| P(N4) | 0.35439 | 0.11797 | 0.06931 | 0.00209 | 0.00016 |
| REJECT IF P(N4)≧0.05 | REJECTED | REJECTED | REJECTED | ADOPTED | ADOPTED |

FIG. 8

| DETECTION SIZE | ALL | 0.3 μm OR MORE | 0.4 μm OR MORE | 0.5 μm OR MORE | 0.7 μm OR MORE |
|---|---|---|---|---|---|
| ① GOOD WITHOUT DEFECT | 3 | 8 | 11 | 30 | 48 |
| ② FAILURE WITHOUT DEFECT | 2 | 5 | 7 | 21 | 42 |
| ③ GOOD WITH DEFECT | 54 | 49 | 46 | 27 | 9 |
| ④ FAILURE WITH DEFECT | 76 | 73 | 71 | 57 | 36 |
| THE NUMBER OF PROCESS FAULTY CHIPS (NB) | NOT CALCULATE | NOT CALCULATE | NOT CALCULATE | 38.1 | 28.1 |
| FATALITY RATE | NOT CALCULATE | NOT CALCULATE | NOT CALCULATE | 0.454 | 0.625 |
| P(N4) | 0.35439 | 0.11797 | 0.06931 | 0.00209 | 0.00016 |
| REJECT IF P(N4) ≧ 0.05 | REJECTED | REJECTED | REJECTED | ADOPTED | ADOPTED |

FIG. 10

| DETECTION SIZE | ALL | 0.3 μm OR MORE | 0.4 μm OR MORE | 0.5 μm OR MORE | 0.7 μm OR MORE |
|---|---|---|---|---|---|
| ① GOOD WITHOUT DEFECT | 3 | 8 | 11 | 30 | 48 |
| ② FAILURE WITHOUT DEFECT | 2 | 5 | 7 | 21 | 42 |
| ③ GOOD WITH DEFECT | 54 | 49 | 46 | 27 | 9 |
| ④ FAILURE WITH DEFECT | 76 | 73 | 71 | 57 | 36 |
| THE NUMBER OF PROCESS FAULTY CHIPS (NB) | 40.0 | 42.4 | 41.7 | 38.1 | 28.1 |
| FATALITY RATE | 0.308 | 0.347 | 0.357 | 0.454 | 0.625 |
| P(N4) | 0.35439 | 0.11797 | 0.06931 | 0.00209 | 0.00016 |
| REJECT IF P(N4) ≥ 0.10 | REJECTED | REJECTED | ADOPTED | ADOPTED | ADOPTED |

F I G . 1 1
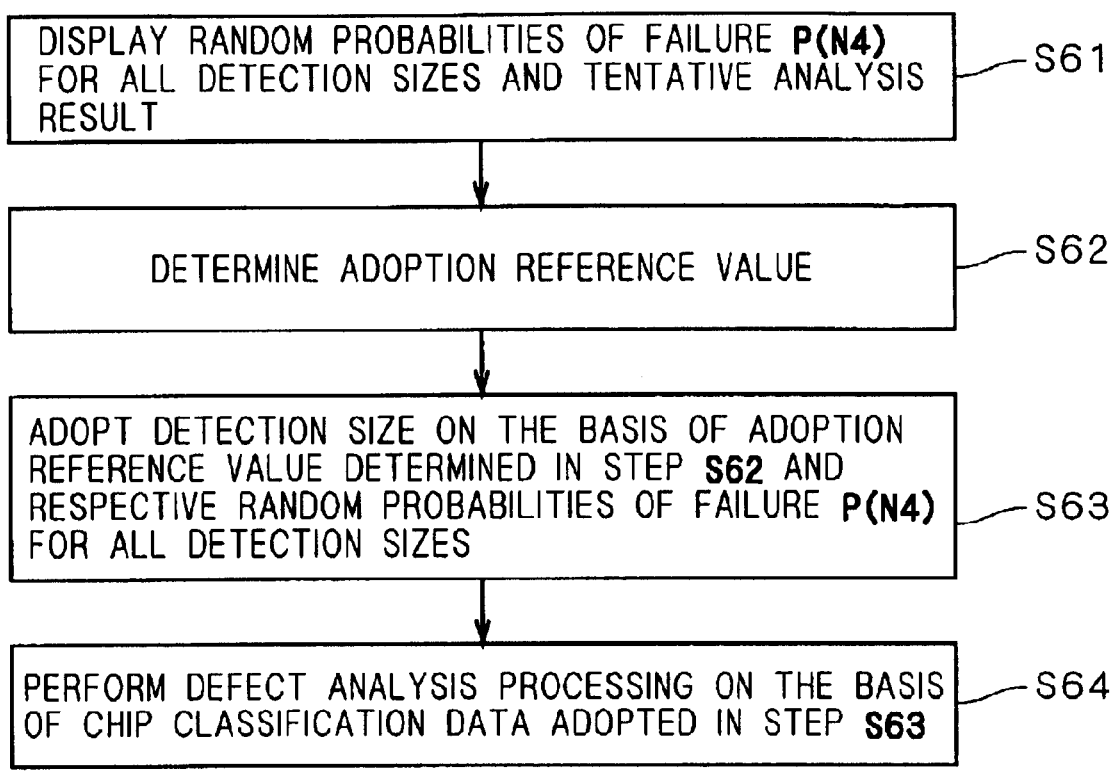

FIG. 12

| DETECTION SIZE | ALL | 0.3 μm OR MORE | 0.4 μm OR MORE | 0.5 μm OR MORE | 0.7 μm OR MORE |
|---|---|---|---|---|---|
| ① GOOD WITHOUT DEFECT | 3 | 8 | 11 | 30 | 48 |
| ② FAILURE WITHOUT DEFECT | 2 | 5 | 7 | 21 | 42 |
| ③ GOOD WITH DEFECT | 54 | 49 | 46 | 27 | 9 |
| ④ FAILURE WITH DEFECT | 76 | 73 | 71 | 57 | 36 |
| THE NUMBER OF PROCESS FAULTY CHIPS (NB) | 40.0 | 42.4 | 41.7 | 38.1 | 28.1 |
| FATALITY RATE | 0.308 | 0.347 | 0.357 | 0.454 | 0.625 |
| P(N4) | 0.35439 | 0.11797 | 0.06931 | 0.00209 | 0.00016 |

ADOPTION REFERENCE VALUE SR = ?

F I G . 1 3

| DETECTION SIZE | ALL | 0.3 μm OR MORE | 0.4 μm OR MORE | 0.5 μm OR MORE | 0.7 μm OR MORE |
|---|---|---|---|---|---|
| ① GOOD WITHOUT DEFECT | 3 | 8 | 11 | 30 | 48 |
| ② FAILURE WITHOUT DEFECT | 2 | 5 | 7 | 21 | 42 |
| ③ GOOD WITH DEFECT | 54 | 49 | 46 | 27 | 9 |
| ④ FAILURE WITH DEFECT | 76 | 73 | 71 | 57 | 36 |
| THE NUMBER OF PROCESS FAULTY CHIPS (NB) | 40.0 | 42.4 | 41.7 | 38.1 | 28.1 |
| FATALITY RATE | 0.308 | 0.347 | 0.357 | 0.454 | 0.625 |
| P(N4) | 0.35439 | 0.11797 | 0.06931 | 0.00209 | 0.00016 |
| REJECT IF P(N4) ≧ 0.10 | REJECTED | REJECTED | ADOPTED | ADOPTED | ADOPTED |

| | |
|---|---|
| OPTIMUM SENSITIVITY DETECTION SIZE | 0.4 μm OR MORE |
| THE NUMBER OF PROCESS FAULTY CHIPS | 41.7 |
| FATALITY RATE | 0.357 |

- 52 D-PROCESS NEW DEFECTS   45 CHIPS
- ☐ FAILURE 78 CHIPS
- ☐ GOOD    57 CHIPS

① GOOD CHIPS WITHOUT DEFECT | ③ GOOD CHIPS WITH DEFECT

② FAULTY CHIPS WITHOUT DEFECT | ④ FAULTY CHIPS WITH DEFECT

COMPUTER-IMPLEMENTED METHOD OF DEFECT ANALYSIS

BACKGROUND OF THE INVENTION

1. Field of the Invention

The present invention relates to a computer-implemented method of defect analysis for analyzing failure causes such as electrical properties on a semiconductor device on which presence/absence of defects can be checked at some point in a manufacturing process.

2. Description of the Background Art

As a background-art defect analysis method for analyzing failure causes such as electrical properties on a semiconductor device on which presence/absence of defects can be checked at some point in a manufacturing process, an analysis method is disclosed in Japanese Patent Application Laid Open Gazette No. 11-264797.

Disclosed in the above gazette is a defect analysis method paying its attention to new defects caused in a predetermined process step among a plurality of manufacturing process steps. The background-art defect analysis method will be discussed below in detail.

For specific discussion, devices are manufactured through six process steps A, B, C, D, E and F and the devices are subjected to a defect inspection by an inspection apparatus after each of the process steps A to F.

It is assumed, for example, that a process for manufacturing a DRAM consists of six process steps, i.e., the process step A of forming patterns of underlying oxide films, the process step B of forming transistors (for memory cell array, for controlling the memory cell array and the like), the process step C of forming capacitors (for memory cell), the process step D of forming (interlayer) insulating films, the process step E of forming metal wires (in the direction of row) and the process step F of forming metal wires (in the direction of column).

In the following discussion, the process step D is regarded as the predetermined process step to make an analysis.

First, new defects caused in the process step D are extracted. In this case, as shown in FIG. 17, there are a lot of defects 5, such as pattern defects, foreign matters, contaminant deposition and damages, which are detected on a wafer map 4 after the process step D. Among the defects 5 on the wafer map 4, defects caused only in the process step D are judged to be new defects 9, which are present on new regions other than coordinates of new defects 6 to 8 on wafer maps 1 to 3, which are already detected in the process steps A to C precedent to the process step D, and coordinates of defect neighborhood regions including error ranges 15.

Specifically, as shown in the graph of FIG. 18, the number of defects which is obtained by subtracting the number of new defects 6 to 8 detected in the process steps A to C and the number of defects on the same coordinates as the error ranges 15 from the total number of defects 5 on the wafer map 4 of the process step D corresponds to the number of new defects 9.

Next, after the process steps A to F are finished, a judgment result of pass/fail is obtained on respective integrated circuits formed on all the chips on a wafer with an electrical tester for judging pass/fail on an electrical operation. Further, the electrical tester generally performs a pass/fail test on the basis of a comprehensive result obtained through a plurality of partial electrical tests each for judging pass/fail on a specific electrical property.

Then, as shown in FIG. 19, a plurality of extracted chips on which presence/absence of the new defects 9 caused only in the process step D is judged and a plurality of chips on which pass/fail is judged as above are collated on a wafer map 20. As shown in FIG. 19, there are 52 new defects caused in the process step D, which are distributed in 45 chips. There are 78 faulty chips detected by the electrical tester and 57 good chips, totally 135 chips.

These 135 chips are classified by chips into four sorts, i.e., ① 48 good chips without defect, ② 42 faulty chips without defect, ③ 9 good chips with defect and ④ 36 faulty chips with defect, as shown in FIG. 20.

In this defect analysis method, even a chip with more than one defect is classified into the same category of "with defect" as a chip with only one defect. Though there is another method in which a chip with more than one defect is weighted accordingly, in this defect analysis method, calculation proceeds without weighting. After this point, the number of defects is not involved in this analysis procedure and counting is made simply on the number of chips with defect. Therefore, since a chip with collective defects is regarded as a chip in the class ③ or ④, classification considering little effect of collective defects can be performed.

Herein discussion will be made on the meaning of classification of the chips into four sorts. The classes ③ and ④, which include the chips with defect, are affected by the process step D. In contrast to this, the classes ① and ② are unaffected by the process step D. Accordingly, the classes ① and ② have better yield than the classes ③ and ④. The classes ① and ②, however, are affected by any one of the five process steps A, B, C, E or F. Therefore, if the classes ③ and ④ are unaffected by the process step D, it can be supposed that the classes ③ and ③ should have the same yield as the classes ① and ②.

The rate of failure RB1 (=1—the rate of good=1—yield) of the classes ① and ② is expressed as the following equation (1), wherein it is assumed that ① the number of good chips without defect is N1, ② the number of faulty chips without defect is N2, ③ the number of good chips with defect is N3 and ④ the number of faulty chips with defect is N4.

$$RB1 = \frac{N2}{(N1+N2)} = \frac{42}{(48+42)} \qquad (1)$$

Applying Eq. 1 to the classes ③ and ④, the number NE of faulty chips which are affected by any one of the five process steps A, B, C, E or F other than the process step D is obtained as the following equation (2):

$$NE=(N3+N4) \times RB1=(9+36) \times RB1=21 \qquad (2)$$

Since the actual number of faulty chips in the classes ③ and ④ is the number of chips in the class ④, the number N0 of new faulty chips which are estimated to be failed only by the new defects caused in the process step D is obtained as the following equation (3):

$$N0=N4-NE=36-21=15 \qquad (3)$$

Next, the fatality rate RF of the new defects in the process step D is calculated. From the relation between the rate of failure RB1 in the classes ① and ② and the rate of failure RB3 in the classes ③ and ④, i.e., RB3=N4/(N3+N4)=36/(9+36), the effect of the process step D is considered. Suppose that distribution of defects caused in the process step D is uniform in the areas ③ and ④, the rate of good RG in the process step D is obtained as the following equation (4), according to the law of probability product, on the basis of the rate of good rg1 (=N1/(N1+N2)) in the classes ① and ② and the rate of good rg3 (=N3/(N3+N4)) in the classes ③ and ④.

$$RG = \frac{rg3}{rg1} = 0.375 \qquad (4)$$

Accordingly, the fatality rate RF of the new defects in the process step D is determined by the following equation (5):

$$RF=1-RG=0.625 \qquad (5)$$

This means that 62.5% out of the chips with new defect which are detected by the inspection apparatus are fatal. In this case, the inspection apparatus detects the defects which are not fatal as to 37.5% of the chips and this means that the inspection apparatus works with sufficiently high sensitivity. Thus, with fatality rate, the index of sensitivity of the inspection apparatus can be calculated.

Further, in this supposition, it is only necessary that the distribution of defects caused by the process step D should be uniform in the areas ③ and ④ and it is not necessary that the distribution should be uniform in 135 chips on the whole wafer.

Next, the number of faulty chips caused in the process step D is calculated. From the fact that 62.5% out of the detected chips with new defect are fatal, the number NB of process faulty chips can be obtained as the following equation (6):

$$NB=(N3+N4) \times RF=28.1 \qquad (6)$$

FIG. 21 is a Venn diagram showing this analysis result. Out of 135 chips on the whole wafer, 57 chips are good and 78 chips are failure. Out of 78 faulty chips, the number NB of process faulty chips caused in the process step D is 28.1, and out of these chips, the number N0 of new faulty chips caused only in the process step D is 15. In other words, it is estimated that 13.1 (=28.1−15) chips should become failure in any one or more of the five steps A, B, C, E and F, having nothing to do with the process step D.

Accordingly, out of 78 faulty chips, 63 (=78−15) chips become failure in any one or more of the five steps A, B, C, E and F. Specifically, even if the failure caused by the process step D is completely eliminated and the number of faulty chips caused in the process step D is made 0 from 28.1, for example, there are still 63 faulty chips and the number of good chips increases only by 15. Thus, with the number N0 of new faulty chips in the process step D, the number of good chips which is estimated to increase if the failure in the process step D is completely eliminated can be quantitatively recognized.

In contrast to this, the number NB (=28.1) of process faulty chips on the basis of the fatality rate of the process step D indicates the number of chips to be still failure even if the yield of the five process steps A, B, C, E and F becomes 100%. In other words, the number NB of process faulty chips is a number quantitatively indicating the effect on the yield of only the process step D, and as the number becomes larger, adverse effect on the yield becomes larger.

Though the number of chips which is not integer is obtained by calculation in the above discussion, this number is obtained by calculation under the supposition that the distribution of defects should be uniform, and the like, and there is no problem if the number is used as the analysis result. Thus, the effect on the yield in single process step can be quantitatively calculated.

FIG. 22 is a flowchart showing the defect analysis method in the background art. Discussion will be made below on the procedure of the background-art defect analysis method, assuming that a predetermined process step is the process step D shown in FIGS. 17 and 18.

Referring to FIG. 22, the coordinates of new defects in the predetermined process step and the detection size are extracted by the inspection apparatus after the predetermined process step in the step S1, and judgment on pass/fail is performed by chips with the electrical tester after all the process steps are finished in the step S2. Then, in the step S3, presence/absence of new defects is judged by chips under a discriminating condition that all the detected new defects should be effective.

Next, in the step S4, as shown in FIG. 19, the new defects detected in the step S3 and the pass/fail judgment result obtained in the step S2 are collated on the wafer map and the chip classification data in which the chips are classified into four sorts as indicated by ① to ④ of FIG. 20 is obtained on the basis of the presence/absence of the new defects and the pass/fail judgment.

After that, in the step S5, the rate of failure RB1 in the classes ① and ②, the number NE of faulty chips caused by any of the process steps other than the predetermined process step and the number N0 of new faulty chips which are judged failure only by the new defects caused in the predetermined process step are obtained, as shown in Eqs. (1) to (3). From this number N0 of new faulty chips, the number of faulty chips which would be reduced if the predetermined process step is improved can be quantitatively recognized.

Next, in the step S6, the rate of good RG on the basis of the rate of good rg3 in the classes ③ and ④ and the rate of good rg1 in the classes ① and ② and the fatality rate RF of the new defects caused by the predetermined process step on the basis of the rate of good RG are obtained, as shown in Eqs. (4) and (5). From this fatality rate RF, the sensitivity of the inspection apparatus which performs the defect inspection after the predetermined process step can be quantitatively recognized.

Finally, in the step S7, the number NB of process faulty chips caused in the predetermined process step is obtained on the basis of the fatality rate RF, as shown in Eq. (6). From this number NB of process faulty chips, the effect on the yield of device in the predetermined process step alone can be quantitatively recognized.

As discussed above, in the background-art defect analysis method, the defect analysis processing is performed on the basis of the chip classification data in which the chips are classified into four sorts, i.e., "① good chips without defect, ② faulty chips without defect", ③ good chips with defect and ④ faulty chips with defect".

If there is an extreme bias among the numbers of chips N1 to N4 in the classes ① to ④ and any of the numbers of chips N1 to N4 is extremely small, however, there is good possibility that the analysis result should be largely changed by slight increase and decrease in the respective numbers of classified chips.

Thus, in the background-art defect analysis method, since the analysis result is largely changed by slight increase and decrease in the respective numbers of classified chips, there arises a problem that the reliability of the analysis result may become low.

SUMMARY OF THE INVENTION

It is an object of the present invention is to provide a defect analysis method or a method of verifying chip classification data, by which the reliability of the chip classification data and the analysis result can be enhanced.

The present invention is directed to a computer-implemented method of defect analysis for a device in which an integrated circuit is formed on each of a plurality of chips on a wafer through a plurality of process steps. According to the present invention, the defect analysis method includes the following steps (a) to (f). The step (a) is to detect defects after performing at least one of the plurality of process steps. The step (b) is to judge pass/fail of the integrated circuit of each of the plurality of chips after the plurality of process steps. The step (c) is to judge presence/absence of any of the defects which satisfies a predetermined discriminating condition on each of the plurality of chips in every the at least one process step. The step (d) is to obtain chip classification data in which the plurality of chips are classified into four sorts on the basis of combination of a judgment result of the step (b) and that of the step (c) in every the at least one process step. The step (e) is to calculate the random probability of failure which is a probability that faulty chips not less than the corresponding number of faulty chips with defect should be included in chips of the corresponding number of defective chips which are randomly extracted out of the plurality of chips on the basis of the chip classification data, and in the defect analysis method of the first aspect, the corresponding number of defective chips is equal to the number of chips which are judged to have a defect in the step (c), and the corresponding number of faulty chips with defect is equal to the number of chips which are judged to have a defect in the step (c) and judged to be failed in the step (b). The step (f) is to judge adoption/rejection of the chip classification data on the basis of the random probability of failure and performing a defect analysis processing on the basis of the chip classification data if adopted, to output an analysis result.

By adopting the chip classification data on the basis of the random probability of failure which is a probability that the same phenomenon occurs as in the case of extracting the chips "with defect" even when the chips are randomly extracted, it is possible to enhance the reliability of the analysis result.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a flowchart showing a procedure for a method of verifying chip classification data in accordance with a first preferred embodiment of the present invention;

FIG. 2 is a graph for explanation on random probability of failure $P(N4)$;

FIG. 3 is a flowchart showing a defect analysis method in accordance with a second preferred embodiment of the present invention;

FIG. 5 is a table showing chip classification data and an analysis result thereof;

FIG. 7 is a table for explanation on a specific processing for reliability verification;

FIG. 8 is a table for explanation on a specific processing for defect analysis;

FIG. 10 is a table for explanation on an analysis result by the defect analysis method in accordance with the fifth preferred embodiment of the present invention;

FIG. 11 is a flowchart showing a procedure for verifying the reliability of chip classification data and a defect analysis processing in a defect analysis method in accordance with a sixth preferred embodiment of the present invention;

FIG. 12 is a table for explanation on a specific operation for reliability verification in accordance with the sixth preferred embodiment of the present invention;

FIG. 13 is a table for explanation on a specific operation for defect analysis in accordance with the sixth preferred embodiment of the present invention;

DESCRIPTION OF THE PREFERRED EMBODIMENTS

<The First Preferred Embodiment>

FIG. 1 is a flowchart showing a procedure for a method of verifying chip classification data in accordance with the first preferred embodiment of the present invention. Referring to FIG. 1, a procedure of the method will be discussed below with a specific example.

Figure 17:
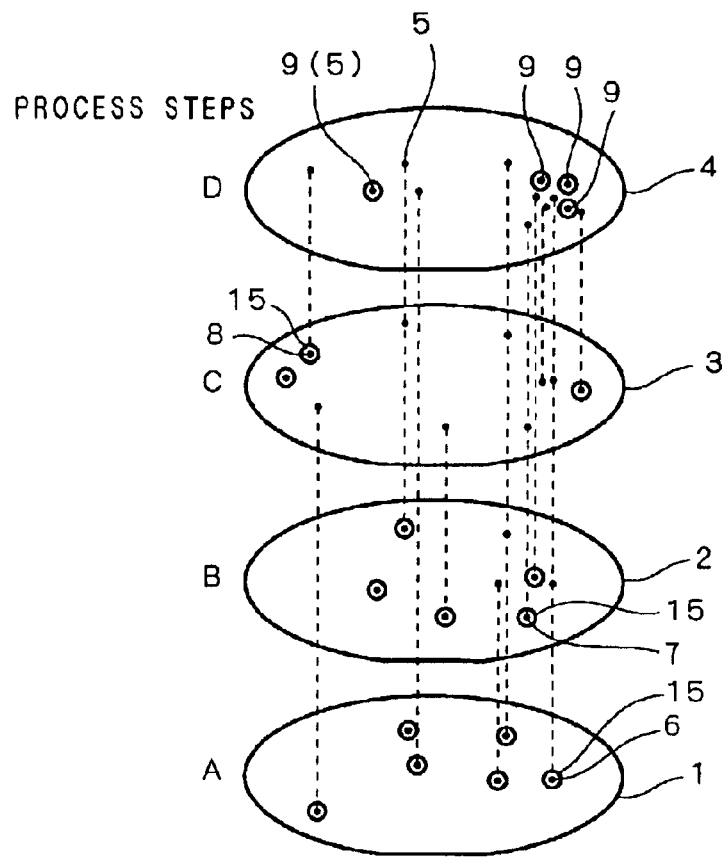
FIG. 17 is a view illustrating a method of detecting new defects.
Figure 18:
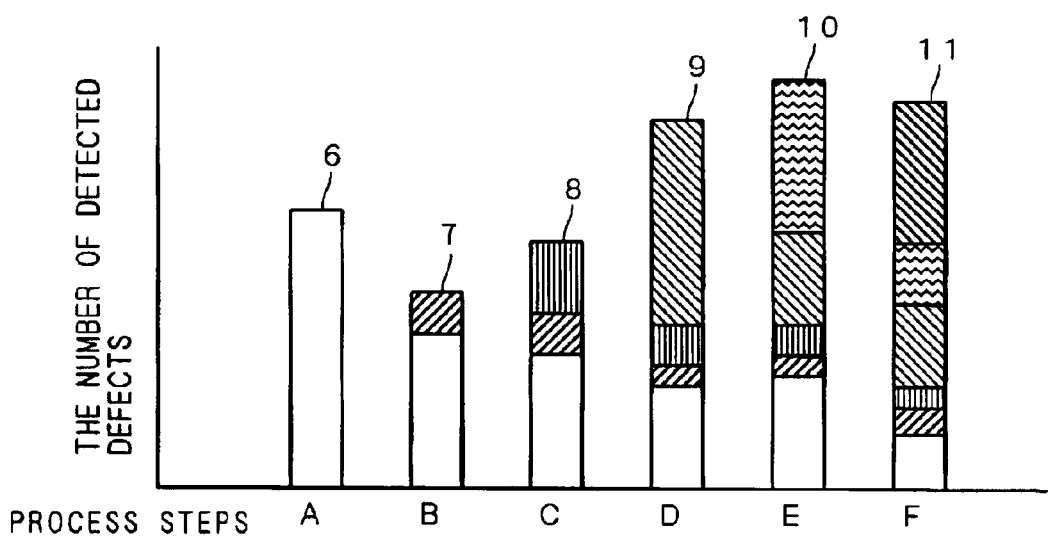
FIG. 18 is a graph showing a relation between the number of detected defects and the number of new defects in each process step.
Figure 19:
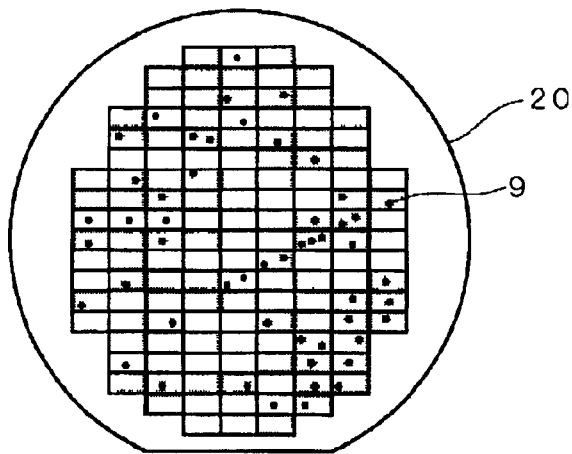
FIG. 19 is a view illustrating a collation of presence/absence of new defects and pass/fail on a wafer map in a defect analysis method of the background art.
Figure 20:
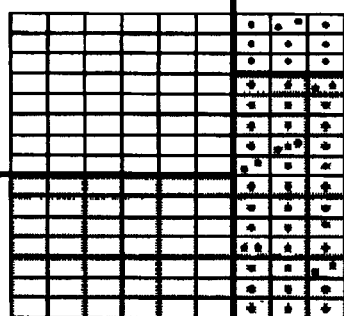
FIG. 20 is a view illustrating classification by chips in the background-art defect analysis method.
Figure 21:
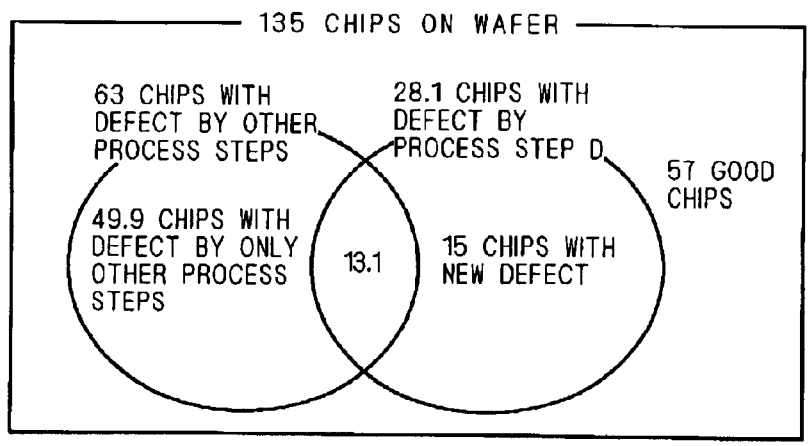
FIG. 21 is a Venn diagram showing an analysis result by the defect analysis method in the background art.

First, in the step S11, chip classification data in which a plurality of chips are classified into four sorts on the basis of presence/absence of (new) defects and pass/fail (of integrated circuits) is obtained. Further, as a specific method therefor, for example, the procedure as shown in the steps S1 to S4 of FIG. 22 in the background art discussed with reference to FIGS. 17 to 22 is used to obtain the chip classification data. It is assumed, in the first preferred embodiment, that the respective distributions of new defects caused in the process steps A to F as shown in FIGS. 17 and 18 are independent from one another.

Herein, we consider the case where in the chip classification data, "① the number N1 of good chips without defect is 3, ② the number N2 of faulty chips without defect is 2, ③ the number N3 of good chips with defect is 54 and ④ the number N4 of faulty chips with defect is 76".

In this case, the total number (N1+N2+N3+N4) is 135, the number of good chips (N1+N3) is 57, the number of faulty chips (N2+N4) is 78, the number of chips without defect (N1+N2) is 5 and the number of chips with defect (N3+N4) is 130.

Next, in the step S12 set is a situation where chips are randomly extracted out of all the chips (135 chips in the above example) with the equivalent of the number of chips with defect (130 chips in the above example) used as random extraction number on the basis of the chip classification data obtained in the step S11.

After that, in the step S13 obtained is the random probability of failure P(N4) which is a probability that the number of faulty chips included in the randomly-extracted chips should be not less than the equivalent of the number N4 of faulty chips with defect (76 chips in the above example).

In the above-discussed example, the probability p(76) that 76 faulty chips are included in the 130 chips which are randomly extracted out of 135 chips is obtained by the following equation (7):

$$p(76) = \frac{{}_{(N1+N3)}C_{N3} \times {}_{(N2+N4)}C_{N4}}{{}_{(N1+N2+N3+N4)}C_{(N3+N4)}} = \frac{{}_{57}C_{54} \times {}_{78}C_{76}}{{}_{135}C_{130}} = 0.253440 \quad (7)$$

From Eq. (7), it can be estimated that if 130 chips are randomly extracted, 76 faulty chips (76=the number N4 of faulty chips with defect) would be present in the randomly-extracted 130 chips with the probability of about 25%.

Next, the probability p(77) that 77 faulty chips are included in the 130 chips which are randomly extracted out of 135 chips and the probability p(78) that 78 faulty chips are included in the 130 chips are obtained by the following equations (8) and (9), respectively:

$$p(77) = \frac{{}_{57}C_{53} \times {}_{78}C_{77}}{{}_{135}C_{130}} = 0.088869 \quad (8)$$

$$p(78) = \frac{{}_{57}C_{52} \times {}_{78}C_{78}}{{}_{135}C_{130}} = 0.012077 \quad (9)$$

Further, since the total number of faulty chips is 78, p(79) becomes "0" as expressed by the following equation (10). Similarly, p(80) and the following probabilities become "0".

$$p(79)=0 \quad (10)$$

Therefore, the random probability of failure P(N4) (p(76)) which is a probability that the number of faulty chips included in the randomly-extracted 130 chips should be not less than 76 is determined by the following equation (11):

$$P(N4) = P(76) \quad (11)$$
$$= p(N4) + p(N4+1) + p(N4+2) + \ldots +$$
$$p(N3+N4-1) + p(N3+N4)$$
$$= p(N4) + p(N4+1) + p(N2+N4) + 0 + \ldots + 0$$
$$= p(76) + p(77) + p(78)$$
$$= 0.35439$$

FIG. 2 is a graph for explanation on random probability of failure P(N4). As shown in FIG. 2, the random probability of failure P(N4) is the sum of p(N4) to p(Nmax). Further, the maximum number Nmax of faulty chips is expressed as; Nmax=N2+N3. Furthermore, the total number Ntotal of samples is expressed as; Ntotal=N1+N2+N3+N4.

Thus, when the probability that faulty chips in a range from the number N4 of faulty chips with defect to the maximum number Nmax of faulty chips should be present in the randomly-extracted 130 chips is relatively easily obtained, the random probability of failure P(N4) can be efficiently calculated.

As shown in Eq. (11), the random probability of failure P(76) is about 0.35 and it can be understood that if 130 chips are randomly extracted, 76 faulty chips would be present in the randomly-extracted 130 chips with the probability of about 35%.

This means that the probability that the faulty chips of N4 (the number of faulty chips included in the chips of (N3+N4) (the number of chips classified as "with defect")) or more should be included in the chips of random extraction number (N3+N4) is as much as 35%.

In other words, though the chips are classified according to the criterion of "with defect", if the same phenomenon as in the case of extracting the chips "with defect" occurs with high probability even when the chips are randomly extracted, the criterion of "with defect" has little effect and there arises a doubt of accidental classification, and therefore it is estimated that such chip classification data has low reliability as data for the defect analysis processing.

Thus, in the first preferred embodiment, by obtaining the random probability of failure P(N4), it is possible to quantitatively verify the reliability of the chip classification data for the defect analysis processing.

Further, obtaining the random probability of failure P(N4) which is a probability that the number of faulty chips included in the chips with defect (130 chips) which are randomly extracted out of all the chips (135 chips) should be the number N4 of faulty chips with defect (76 chips) or more is equivalent to obtaining the probability Q(N3) that the number of manufactured good chips should be the number N3 of good chips with defect (54 chips) or less.

Furthermore, obtaining the random probability of failure P(N4) is equivalent to obtaining the probability P(N1) that the number of manufactured good chips included in the chips without defect (5 chips) which are randomly extracted out of all the chips (135 chips) should be the number N1 of good chips without defect (3 chips) or more and to obtaining the probability Q(N2) that the number of manufactured faulty chips included in the chips without defect (5 chips) which are randomly extracted out of all the chips (135 chips) should be the number N2 of faulty chips without defect (2 chips) or less.

Therefore, instead of the random probability of failure P(N4), the random probability of good Q(N3), the probability P(N1) or the probability Q(N2) may be used.

<The Second Preferred Embodiment>

FIG. 3 is a flowchart showing a defect analysis method in accordance with the second preferred embodiment of the present invention. Referring to FIG. 3, a procedure of the method will be discussed below with a specific example.

Figure 22:
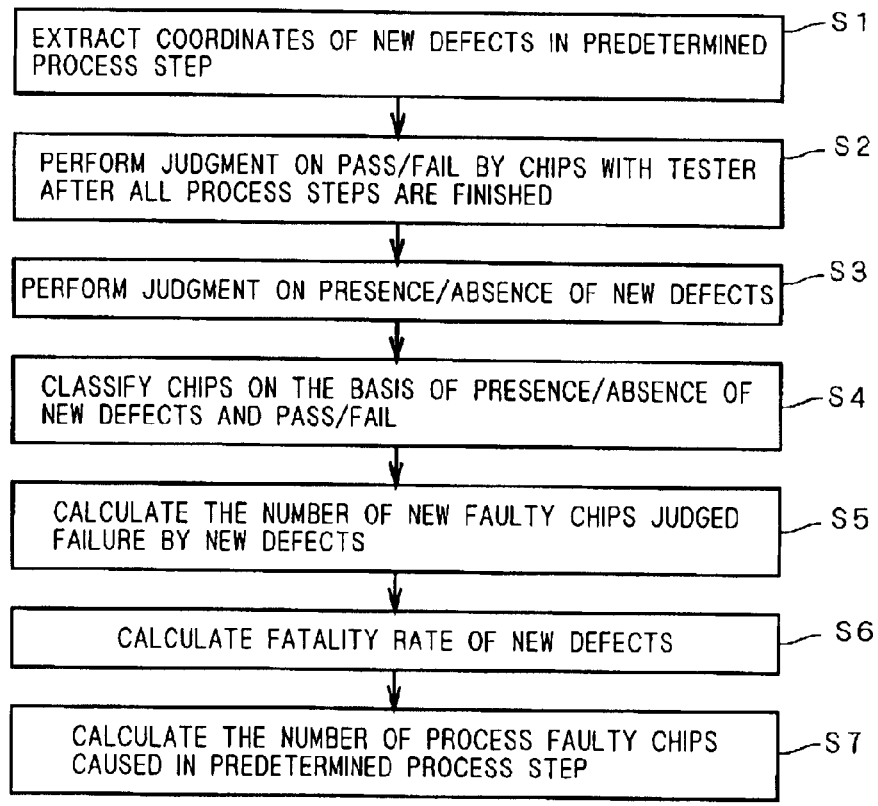
FIG. 22 is a flowchart showing a procedure of the defect analysis method in the background art.

First, in the step S21, chip classification data in which a plurality of chips are classified into four sorts on the basis of presence/absence of defects and pass/fail is obtained. Further, as a specific method therefor, for example, the procedure as shown in the steps S1 to S4 of FIG. 22 is used to obtain the chip classification data.

Next, in the step S22, the random probability of failure P(N4) is calculated. Further, as a specific method therefor, for example, the procedure as shown in the steps S12, S13 and the like of FIG. 1 in the first preferred embodiment is used to calculate the random probability of failure P(N4).

For example, if "① the number N1 of good chips without defect is 3, ② the number N2 of faulty chips without defect is 2, ③ the number N3 of good chips with defect is 54 and ④ the number N4 of faulty chips with defect is 76", like in the first preferred embodiment, the random probability of failure P(N4) is about 0.35.

Then, in the step S23, comparison between the random probability of failure P(N4) and the reference value "0.05" for adopting the chip classification data is made and the procedure goes to the step S24 if P(N4)≧0.05 and goes to the step S25 if P(N4)<0.05.

In the step S24 which is executed when "P(N4)≧0.05" in the step S23, it is judged that the chip classification data obtained in the step S21 has low reliability for the defect analysis processing (for the reason discussed earlier in the first preferred embodiment), and then the chip classification data is rejected and the defect analysis processing (for example, the analysis processing by the background-art defect analysis method as shown in the steps S5 to S7 of FIG. 22) is cancelled.

On the other hand, in the step S25 which is executed when "P(N4)<0.05" in the step S23, it is judged that the chip classification data obtained in the step S21 has high reliability for the defect analysis processing, and then the defect analysis processing is performed on the basis of the chip classification data, to output an analysis result.

Further, in the above example, since the random probability of failure P(N4) is about 0.35, the judgment is "Yes" in the step S23 and the defect analysis processing is cancelled in the step S24.

Thus, in the second preferred embodiment, since the defect analysis processing is performed with only the chip classification data which is judged to have high reliability on the basis of the random probability of failure P(N4) used as effective data, it is possible to obtain an analysis result of high reliability at all times.

<The Third Preferred Embodiment>

Figure 4:
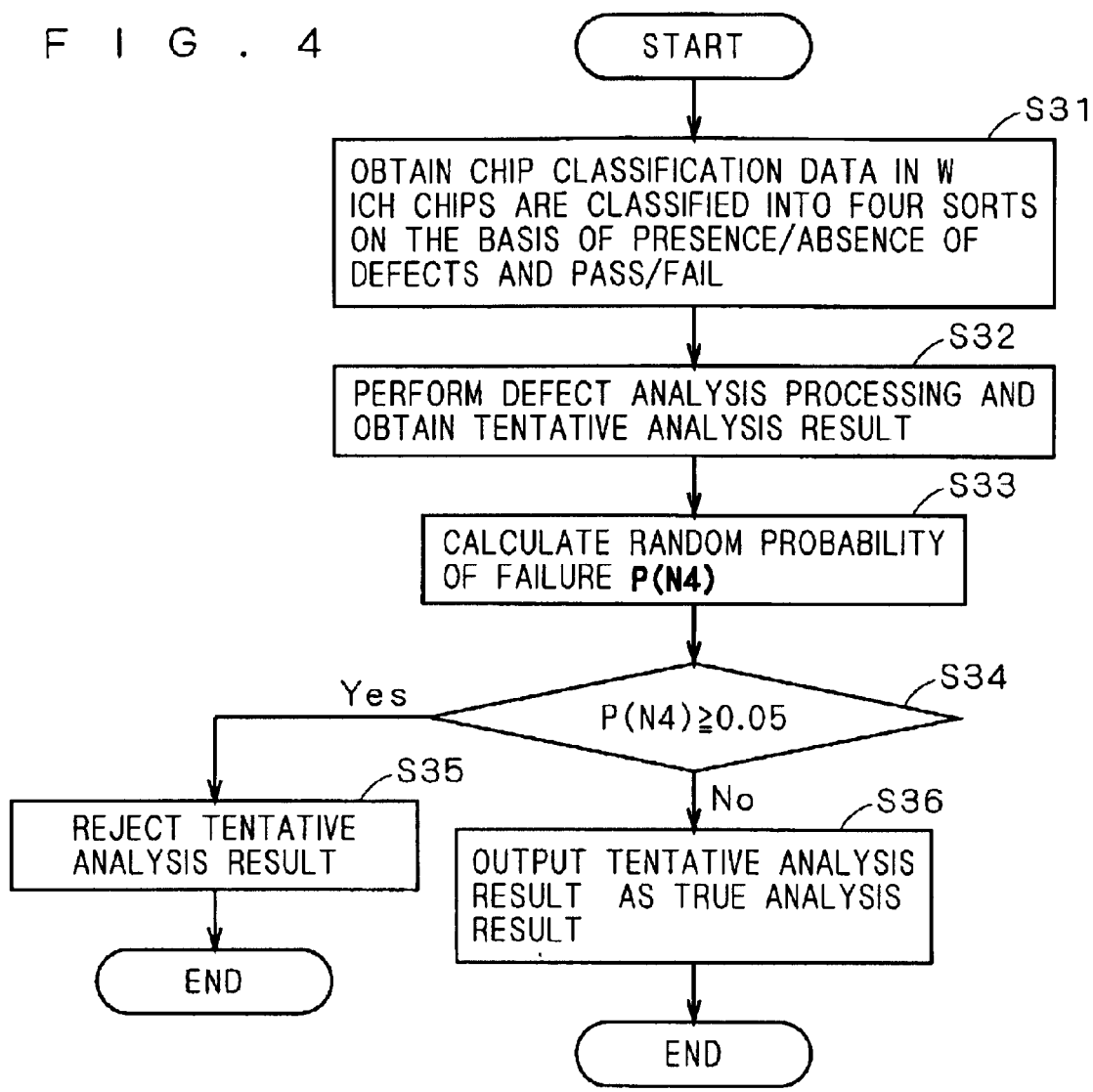
FIG. 4 is a flowchart showing a defect analysis method in accordance with a third preferred embodiment of the present invention.

FIG. 4 is a flowchart showing a defect analysis method in accordance with the third preferred embodiment of the present invention. Referring to FIG. 4, a procedure of the method will be discussed below with a specific example.

First, in the step S31, chip classification data in which a plurality of chips are classified into four sorts on the basis of presence/absence of defects and pass/fail is obtained, like in the second preferred embodiment.

Next, in the step S32, the defect analysis processing is performed on the basis of the chip classification data, to obtain a tentative analysis result.

After that, in the step S33, the random probability of failure P(N4) is calculated, like in the second preferred embodiment.

Then, in the step S34, comparison between the random probability of failure P(N4) and the reference value "0.05" for adopting the chip classification data is made, and the procedure goes to the step S35 if P(N4)≧0.05 and the procedure is finished without rejecting the tentative analysis result obtained in the step S32 if P(N4)<0.05.

In the step S35 which is executed when "P(N4)≧0.05" in the step S34, the tentative analysis result obtained in the step S32 is judged to have low reliability and is rejected.

On the other hand, in the step S36 which is executed when "P(N4)<0.05" in the step S34, the tentative analysis result obtained in the step S32 is judged to have sufficiently high reliability and is outputted as a true analysis result.

Thus, in the third preferred embodiment, since only the analysis result which is judged to have high reliability on the basis of the random probability of failure P(N4) is adopted as effective one, it is possible to obtain an analysis result of high reliability at all times.

<The Fourth Preferred Embodiment>

(Premise)

In the fourth preferred embodiment, discussion will be made on an analysis method paying its attention to new defects caused in the process step D, like the background-art defect analysis method as shown in FIGS. 17 to 22. First, like in the first preferred embodiment, only the new defects 9 which are not detected until the process step D are extracted (FIGS. 17 and 18).

Next, a plurality of chips on which presence/absence of the extracted new defects 9 caused only in the process step D is judged and a plurality of chips on which pass/fail is judged with the electrical tester are collated on the wafer map.

Though judgment on the presence/absence of the new defects is performed under the discriminating condition that all the extracted new defects are effective in the defect analysis method shown as in FIGS. 17 to 22, it is premised in the fourth preferred embodiment that the presence/absence of the new defects is judged under the discriminating condition that some of the extracted new defects 9 whose size is not less than a predetermined detection size are effective. For example, only the new defects whose size is 0.3 μm or more are adopted. Then obtained is partial chip classification data in which the chips are classified into four sorts according to presence/absence of the new defects having size of 0.3 μm or more and pass/fail.

Similarly, changing the detection size to 0.4 μm or more, 0.5 μm or more, partial chip classification data for each detection size is obtained.

FIG. 5 is a table showing the chip classification data including a plurality of partial chip classification data and an analysis result thereof.

As shown in FIG. 5, among the numbers NB of process faulty chips for all the detection sizes, the maximum number of process faulty chips, 42.4 chips, is obtained when the detection size is 0.3 μm or more. This number of chips, 42.4, indicates the effect of the process step D on the yield more precisely. The detection size for which the number NB of process faulty chips is a maximum value is regarded as the optimum sensitivity of the inspection apparatus.

Therefore, suppose that all the chip classification data have sufficiently high reliability, in the case of FIG. 5, the defect inspection with the optimum sensitivity setting can be performed when the detection size for all the defects is set to be 0.3 μm or more.

Thus, by calculating the analysis results such as the fatality rates RF and the numbers NB of process faulty chips and comparing the calculation results, it is possible to find the detection size for which the inspection apparatus takes the optimum sensitivity, and the like.

Further, from the above analysis result, it becomes possible to quantitatively calculate more precise effect on the yield at all times with the number NB of process faulty chips in the optimum sensitivity setting (detection size).

Since the reliability of the respective partial chip classification data for the defect analysis processing is not verified, however, the analysis result obtained thus does not necessarily have high reliability.

(Method)

Figure 6:
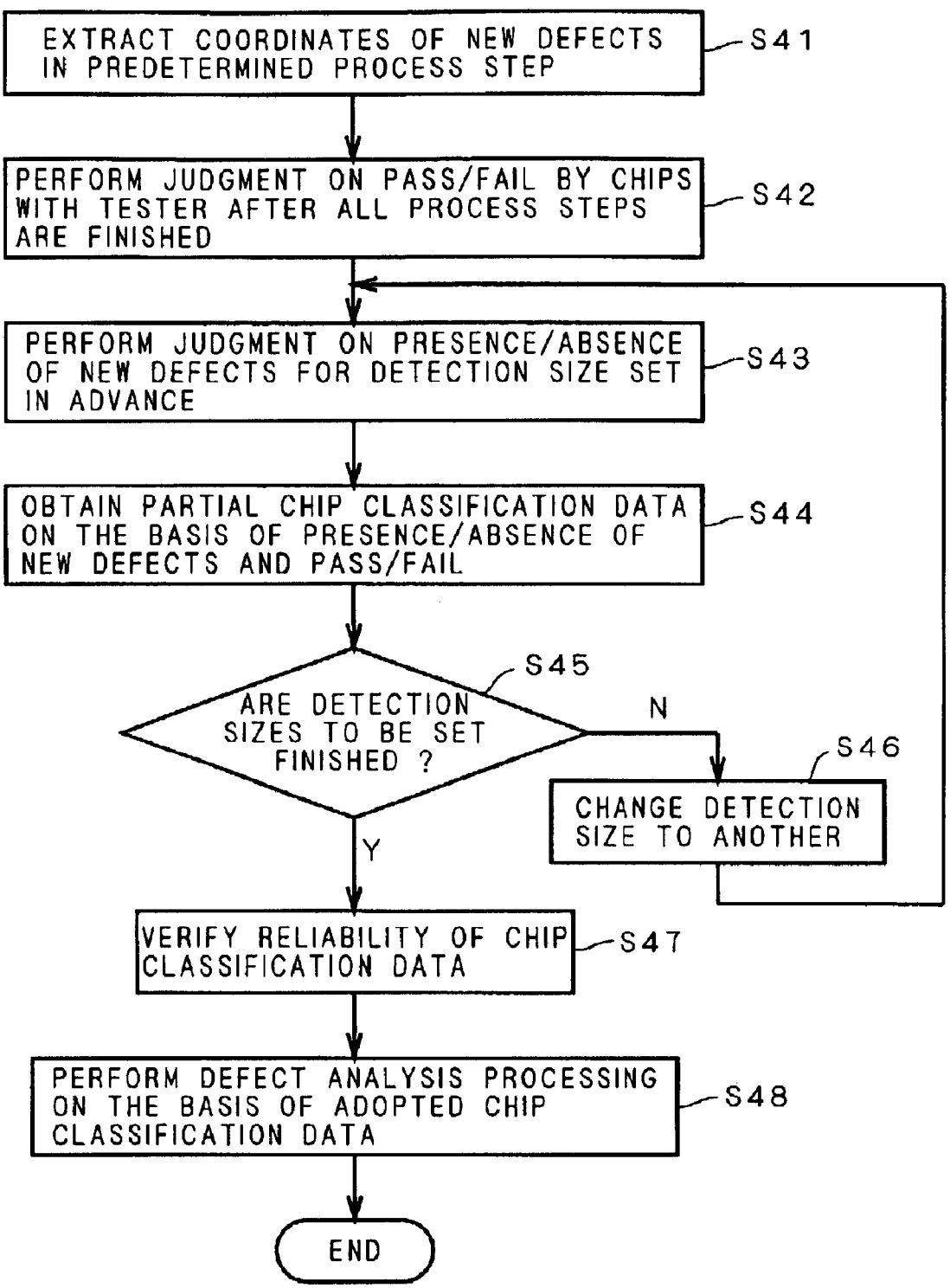
FIG. 6 is a flowchart showing a defect analysis method in accordance with a fourth preferred embodiment of the present invention.

FIG. 6 is a flowchart showing a defect analysis method in accordance with the fourth preferred embodiment of the present invention. Hereinafter, assuming that the predetermined process step is the process step D as shown in FIGS.

17 and 18, the procedure of the fourth preferred embodiment will be discussed.

Referring to FIG. 6, in the step S41, the coordinates of the new defects caused in the predetermined process step are extracted, and subsequently in the step S42, judgment on pass/fail is performed by chips with the electrical tester after all the steps are finished. Then in the step S43, presence/absence of new defects satisfying the discriminating condition of being not less than the detection size which is set in advance.

Subsequently, in the step S44 obtained is partial chip classification data in which the chips are classified into four sorts according to the presence/absence of new defects and the pass/fail on the basis of the judgment results obtained in the steps S42 and S43.

After that, in the step S45, judgment is made on whether the detection sizes to be set are finished or not, and if not finished, the detection size is changed to another in the step S46 and thereafter the steps S43 to S45 are executed, to obtain the partial chip classification data for the detection size which is newly set in the step S44. After that, the steps S46 and S43 to S44 are repeated until it is judged in the step S45 that the detection sizes to be set are finished.

Then, when it is judged that the detection sizes to be set are finished in the step S45, the reliability of all the partial chip classification data for all the detection sizes, in other words, that of the chip classification data is verified in the step S47.

Specifically, in the step S47, the random probability of failure P(N4) for each detection size (partial random probability of failure) is obtained and compared with the adoption reference value SR which is determined in advance. If "P(N4)≧SR", it is judged that the partial chip classification data for this detection size has low reliability and the partial chip classification data is rejected. On the other hand, if "P(N4)<SR", it is judged that the partial chip classification data for this detection size has sufficiently high reliability and the partial chip classification data is adopted.

FIG. 7 is a table for explanation on a specific processing for reliability verification. As shown in FIG. 7, the random probability of failure P(N4) for each detection size is obtained and the adoption reference value SR is determined to be 0.05. If "P(N4)≧0.05", it is judged that the partial chip classification data for this detection size has low reliability and the partial chip classification data is rejected. On the other hand, if "P(N4)<0.05", it is judged that the partial chip classification data for this detection size has sufficiently high reliability and the partial chip classification data is adopted.

As a result, the partial chip classification data for "all" of the detection sizes (all the defects), that for the detection size of "0.3 μm or more" and that for the detection size of "0.4 μm or more" are rejected, and only the partial chip classification data for the detection size of "0.5 μm or more" and that for the detection size of "0.7 μm or more" are adopted.

Returning to FIG. 6, the defect analysis processing is performed on the basis of the chip classification data adopted in the step S48, to obtain the number NB of process faulty chips and the fatality rate RF for only the adopted detection sizes.

FIG. 8 is a table for explanation on a specific processing for defect analysis in the step S48. As shown in FIG. 48, by calculating the number NB of process faulty chips and the fatality rate RF on the basis of only the partial chip classification data for the detection size of "0.51 μm or more" and that for the detection size of "0.71 μm or more", it is possible to obtain an analysis result of higher reliability.

Thus, the defect analysis method of the fourth preferred embodiment can obtain a precise analysis result (see FIG. 8) indicating that the optimum sensitivity setting is the detection size of 0.5 μm or more for which high-reliable partial chip classification data is obtained by performing the defect analysis processing after verifying the reliability of the analysis result (see FIG. 5) which would wrongly indicate that the optimum sensitivity setting is the detection size of 0.3 μm or more for which low-reliable partial chip classification data is obtained if no reliability verification is performed.

In other words, the defect analysis method of the fourth preferred embodiment can achieve the defect analysis processing with higher precision by verifying the reliability of a plurality of partial chip classification data on the basis of a plurality of partial random probabilities of failure (the respective random probabilities of failure P(N4) for all the detection sizes) and then performing the defect analysis processing on the basis of the chip classification data including only the partial chip classification data which satisfy the adoption reference value.

<The Fifth Preferred Embodiment>

The defect analysis method of the fifth preferred embodiment is almost the same as that of the fourth preferred embodiment except the reliability verification for the chip classification data which corresponds to the processing in the step S47 of FIG. 6.

Figure 9:
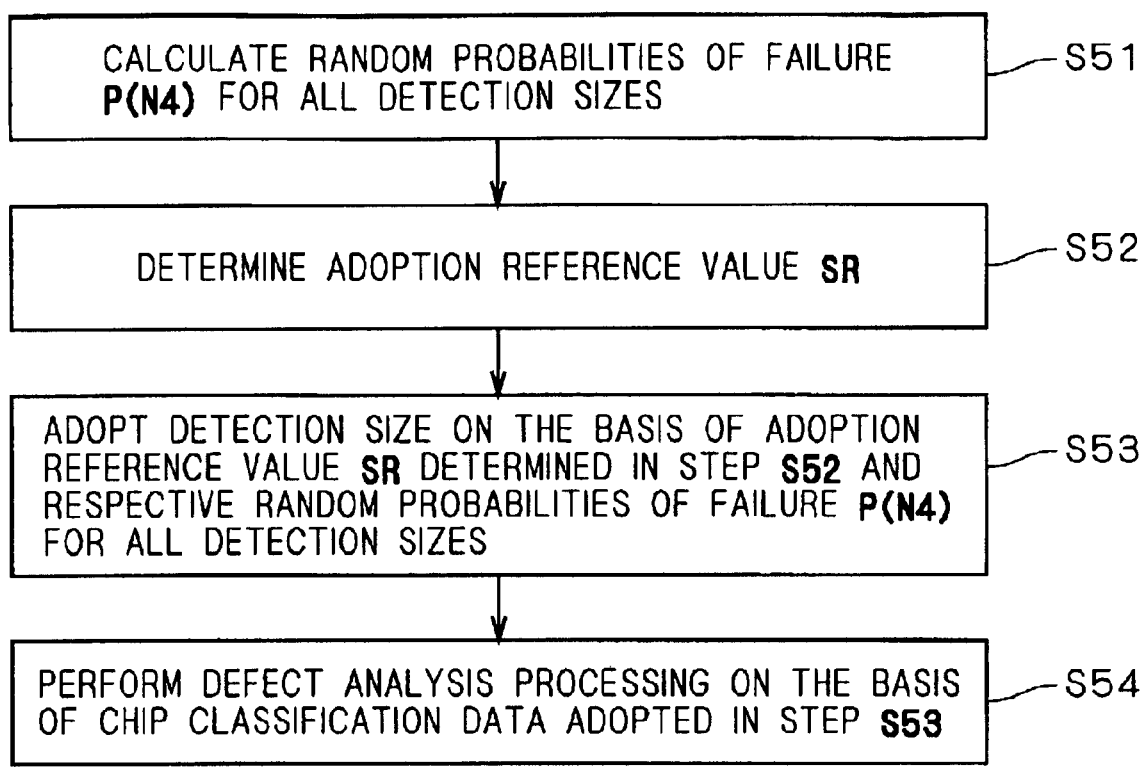
FIG. 9 is a flowchart showing a procedure for verifying the reliability of chip classification data and a defect analysis processing in a defect analysis method in accordance with a fifth preferred embodiment of the present invention.

FIG. 9 is a flowchart showing a procedure for verifying the reliability of chip classification data and a defect analysis processing in a defect analysis method in accordance with the fifth preferred embodiment of the present invention. FIG. 10 is a table for explanation on an analysis result by the defect analysis method in accordance with the fifth preferred embodiment of the present invention. Referring to FIGS. 9 and 10, an operation for reliability verification of the fifth preferred embodiment will be discussed below.

First, in the step S51, the random probability of failure P(N4) for each detection size (partial chip classification data) is calculated.

Then, in the step S52, the adoption reference value SR is determined. For example, the adoption reference value SR is determined to be 0.05.

Subsequently, in the step S53, the partial chip classification data for the detection sizes to be adopted are determined on the basis of the results of comparisons between the adoption reference value SR determined in the step S52 and the respective random probabilities of failure P(N4) for all the detection sizes.

In the case of FIG. 10, the partial chip classification data for "all" of the detection sizes (all the defects) and that for the detection size of "0.3 μm or more" are rejected, and only the partial chip classification data for the detection size of "0.4 μm or more", that for the detection size of "0.5 μm or more" and that for the detection size of "0.7 μm or more" are adopted.

Finally, in the step S54 (substantially the same as the step S48 of FIG. 6), the defect analysis processing is performed on the basis of the chip classification data adopted in the step S53.

In the case of FIG. 10, by calculating the number NB of process faulty chips and the fatality rate RF on the basis of only the partial chip classification data for the detection sizes of "0.4 μm or more", "0.5 μm or more" and "0.7 μm or more", it is possible to obtain an analysis result of higher reliability, reflecting the intention of an analyzer.

As a result, it is possible to recognize form the analysis result of FIG. 10 that the optimum sensitivity setting is the detection size of 0.4 μm or more (for which the number NB of process faulty chips is a maximum value) among the adopted detection sizes (partial chip classification data).

Thus, the defect analysis method of the fifth preferred embodiment can achieve a defect analysis processing with high precision, reflecting the intention of an analyzer, by verifying the respective reliabilities of a plurality of partial chip classification data and performing the defect analysis processing on the basis of the chip classification data including only the partial chip classification data which satisfy the adoption reference value in consideration of the intention of the analyzer.

<The Sixth Preferred Embodiment>

The defect analysis method of the sixth preferred embodiment is almost the same as that of the fourth preferred embodiment except the reliability verification for the chip classification data which corresponds to the processing in the step S47 of FIG. 6.

Figures 14, 15:
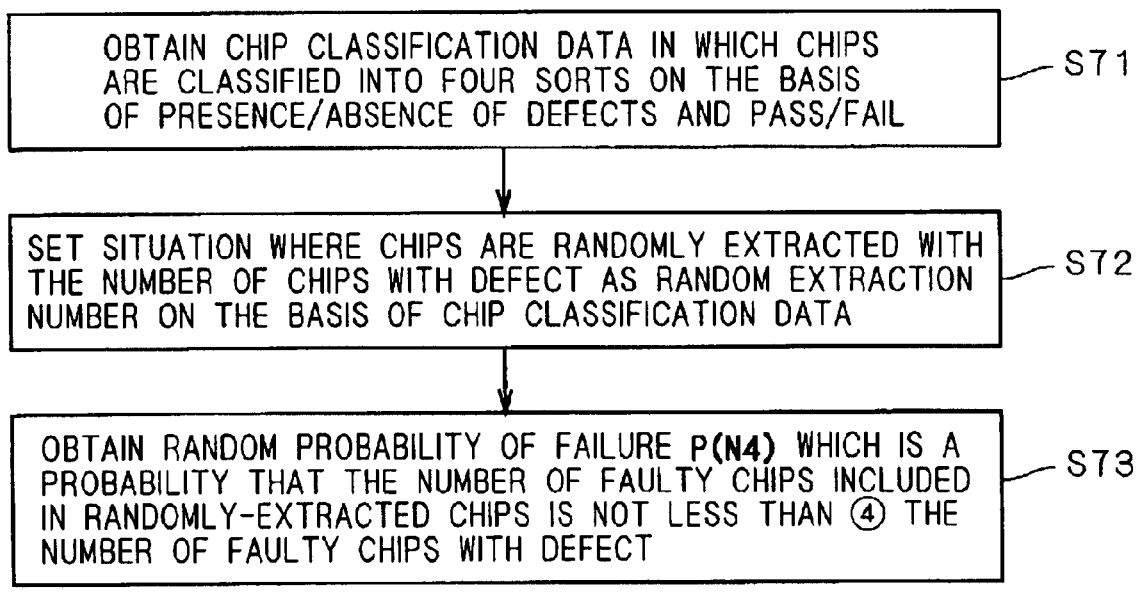
FIG. 14 is a table for explanation on a specific processing for defect analysis in accordance with the sixth preferred embodiment of the present invention.
FIG. 15 is a flowchart showing a procedure for a method of verifying chip classification data in accordance with a seventh preferred embodiment of the present invention.

FIG. 11 is a flowchart showing a procedure for verifying the reliability of chip classification data and a defect analysis processing in a defect analysis method in accordance with the sixth preferred embodiment of the present invention. FIG. 12 is a table for explanation on a specific operation for reliability verification in accordance with the sixth preferred embodiment of the present invention. FIGS. 13 and 14 are tables for explanation on an analysis result by the defect analysis method in accordance with the sixth preferred embodiment of the present invention. Referring to FIGS. 11 to 14, reliability verification of the sixth preferred embodiment will be discussed below.

First, in the step S61, the random probability of failure P(N4) for each detection size (partial chip classification data) and a tentative analysis result which is a partial analysis result on each partial chip classification data are calculated, to display the calculated results visibly for an analyzer.

For example, as shown in FIG. 12 displayed are the tentative analysis result including the numbers NB of process faulty chips and the fatality rates RF on the basis of a plurality of partial chip classification data and the respective random probabilities of failure P(N4) for all the detection sizes (a plurality of partial random probabilities of failure).

Then, in the step S62, the adoption reference value SR is determined. As materials for judgment in setting the adoption reference value SR, the numbers NB of process faulty chips on the basis of the respective partial chip classification data in the tentative analysis result, the chip classification data in the other process steps, analysis results by other analysis methods and the like may be used.

For example, if the tentative analysis result and the random probabilities of failure P(N4) shown in FIG. 12 are obtained, the random probability of failure P(N4) on the basis of the partial chip classification data for the detection size of 0.4 μm or more is about 6.9% and the criterion that "a defect is present" with a probability of about 6.3% has little effect and there arises a doubt of accidental classification, and therefore this partial chip classification data should be rejected if the adoption reference value SR is 0.05 like in the fourth preferred embodiment.

However, when there exists a photograph observed by an electron microscope, showing the defects which are displayed by a defect inspection apparatus in a size range from 0.4 μm to 0.5 μm, and it is recognized in advance from the photograph that the importance of the defects whose sizes ranging from 0.4 μm to 0.5 μm is high, considering that this does not contradict the fact that the number NB of process faulty chips for the detection size of 0.4 μm or more is large as shown in FIG. 12, the adoption reference value SR can be determined to be 0.10 so as to adopt the partial chip classification data for the detection size of 0.4 μm or more.

In other words, in the sixth preferred embodiment, when it is judged that the merit of a review by comparison with other process steps with a conclusion that "the new defect having detection size of 0.4 μm or more" "makes a chip failure" takes priority over the demerit of the conclusion that "the new defect having detection size of 0.4 μm or more" "makes a chip failure" being a mistake, the adoption reference value SR can be determined so as to adopt the partial chip classification data for the detection size of 0.4 μm or more.

Subsequently, in the step S63, the partial chip classification data for the detection sizes to be adopted are determined on the basis of the results of comparisons between the adoption reference value SR determined in the step S62 and the respective random probabilities of failure P(N4) for all the detection sizes.

As a result, as shown in FIG. 13, the partial chip classification data for "all" of the detection sizes (all the defects) and that for the detection size of "0.3 μm or more" are rejected, and only the partial chip classification data for the detection size of "0.4 μm or more", that for the detection size of "0.5 μm or more" and that for the detection size of "0.7 μm or more" are adopted.

Finally, in the step S64 (substantially the same as the step S48 of FIG. 6), the defect analysis processing is performed on the basis of the chip classification data adopted in the step S63.

As a result, as shown in FIG. 14, it is possible to display that the detection size of 0.4 μm or more for which the partial chip classification data is obtained is the optimum sensitivity detection size, and it is possible to visibly recognize the analysis result on the basis of the adoption reference value SR determined in the step S62.

Thus, the defect analysis method of the sixth preferred embodiment can verify the respective reliabilities of a plurality of partial chip classification data on the basis of the adoption reference value SR determined in consideration of the tentative analysis result.

Further, in the processing of the sixth preferred embodiment, by displaying the optimum sensitivity detection size and the number NB of process faulty chips not only on one process step but also on the other process steps, comparison in the number NB of process faulty chips can be easily made among the process steps.

Furthermore, by executing a program describing the procedure as shown in the steps S61 to S64 with a computer, it is possible to automate the processings except the setting of the adoption reference value SR.

<The Seventh Preferred Embodiment>

The seventh preferred embodiment provides another method of calculating the random probability of failure P(N4) in the method of verifying chip classification data of the first preferred embodiment.

FIG. 15 is a flowchart showing a procedure for a method of verifying chip classification data in accordance with the seventh preferred embodiment of the present invention. Referring to FIG. 15, a procedure of the method will be discussed below with a specific example.

First, in the step S71, chip classification data in which a plurality of chips are classified into four sorts on the basis of presence/absence of defects and pass/fail is obtained.

Herein, we consider the same case as the first preferred embodiment where in the chip classification data, "① the number N1 of good chips without defect is 3, ② the number N2 of faulty chips without defect is 2, ③ the number N3 of good chips with defect is 54 and ④ the number N4 of faulty chips with defect is 76".

Next, in the step S72 set is a situation where chips are randomly extracted out of all the chips (135 chips in the above example) with the equivalent of the number of chips with defect (130 chips in the above example) used as random extraction number on the basis of the chip classification data obtained in the step S71.

After that, in the step S73 obtained is the random probability of failure P(N4) which is a probability that the number of faulty chips included in the randomly-extracted chips should be not less than the equivalent of the number N4 of faulty chips with defect (76 chips in the above example).

In the above-discussed example, the sum of the probabilities p(0) to p(130), indicating that 0 to 130 faulty chips are included in the 130 chips which are randomly extracted out of 135 chips, naturally becomes "1" as expressed by the following equation (12):

$$p(0)+p(1)+p(2)+p(3)+\ldots+p(N3+N4-1)+p(N3+N4)=1 \qquad (12)$$

Accordingly, the random probability of failure P(76) is expressed by the following equation (13):

$$\begin{aligned} P(76) &= 1 - (p(1) + p(2) + \ldots + p(N4-2) + p(N4-1)) \qquad (13)\\ &= 1 - (p(1) + p(2) + p(3) + \ldots + p(74) + p(75)) \end{aligned}$$

In this case, since there are only 5 chips without defect, even if suppose that all 5 chips which are not extracted are faulty chips, 73 (=78−5) chips are included in the randomly-extracted 130 chips. In other words, if $j \leq 72$, p(j)=0, as expressed by the following equation (14):

$$p(1)=p(2)=p(3)=\ldots=p2+N4-N1N2-2)=p(N2+N4-N1-N2-1)=0$$
$$p(1)=p(2)=p(3)=\ldots=p(N4-N1-2)=p(N4-N1-1)=0$$
$$p(1)=p(2)=p(3)=\ldots=p(71)=p(72)=0 \qquad (14)$$

Accordingly, from Eq. (14), Eq. (13) can be simplified into the following equation (15), and the random probability of failure P(76) can be calculated. The value obtained from Eq. (15) is equivalent to the value obtained from Eq. (11) in the first preferred embodiment.

$$\begin{aligned} P(76) &= 1 - (p(1) + p(2) + \ldots + (N4-2) + p(N4-1)) \qquad (15)\\ &= 1 - (p(1) + p(2) + p(3) + \ldots + (N4-N1-1) + \\ & \quad p(N4-N1) + p(N4-N1+1) + \ldots + p(74) + p(75))\\ &= 1 - (p(N4-N1) + p(N4-N1+1) + \ldots p(74) + p(75))\\ &= 1 - (0 + \ldots + 0 + p(73) + p(74) + p(75))\\ &= 1 - (0.060891 + 0.234514 + 0.350208)\\ &= 0.35439 \end{aligned}$$

Thus, when the probability that faulty chips in a range from "O" to the number (N4−1) obtained by subtracting "1" from the number N4 of faulty chips with defect should be present in the randomly-extracted 130 chips is relatively easily obtained, the random probability of failure can be efficiently calculated.

Figure 16:
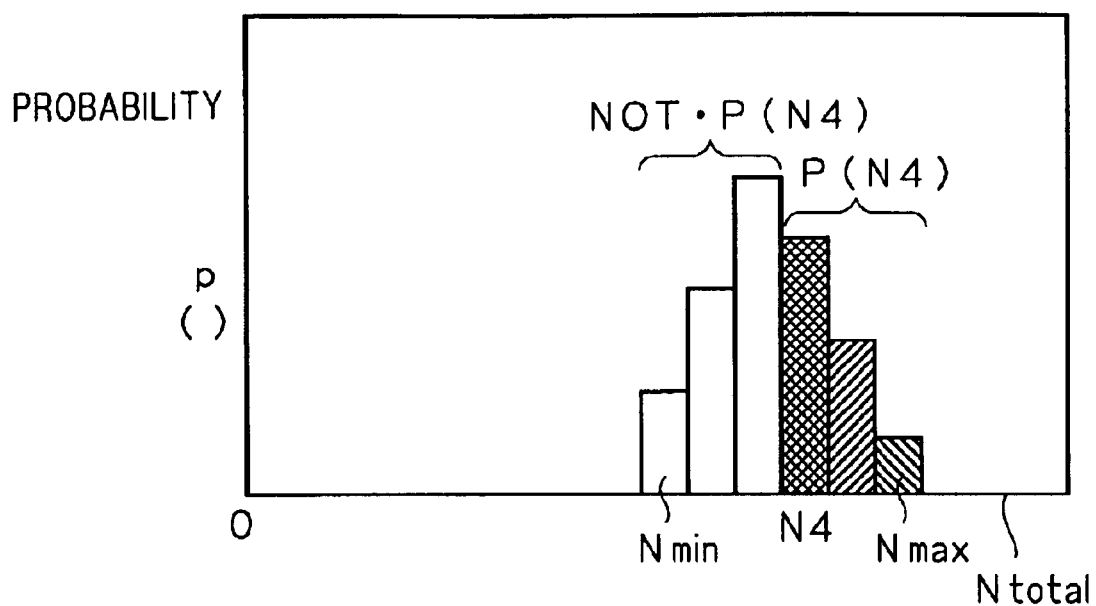
FIG. 16 is a graph for explaining a method of calculating random probability of failure $P(N4)$ in accordance with the seventh preferred embodiment of the present invention.

FIG. 16 is a graph for explaining a method of calculating the random probability of failure P(N4) in accordance with the seventh preferred embodiment of the present invention. As shown in FIG. 16, though the random probability of failure P(N4) is the sum of p(N4) to p(Nmax), the random probability of failure P(N4) is obtained as a value {1−NOT·P(N4)} obtained by subtracting the probability of complementary event (not random failure) NOT·P(N4) from 1 in the seventh preferred embodiment.

Further, the maximum number Nmax of faulty chips is expressed as; Nmax=N2+N4, and the minimum number Nmin of faulty chips is expressed as; Nmin=N4−N1. Furthermore, the total number Ntotal of samples is expressed as; Ntotal=N1+N2+N3+N4.

Thus, in the seventh preferred embodiment, the random probability of failure P(N4) can be obtained by a method different from that of the first preferred embodiment.

Further, obtaining the random probability of failure P(N4) which is a probability that the number of faulty chips included in the chips with defect (130 chips) which are randomly extracted out of all the chips (135 chips) should be the number N4 of faulty chips with defect (76 chips) or more is equivalent to obtaining the random probability of good Q(N3) which is a probability that the number of manufactured good chips should be the number N3 of good chips with defect (54 chips) or less.

Furthermore, obtaining the random probability of failure P(N4) is equivalent to obtaining the probability P(N1) that the number of manufactured good chips included in the chips without defect (5 chips) which are randomly extracted out of all the chips (135 chips) should be the number N1 of good chips without defect (3 chips) or more and to obtaining the probability Q(N2) that the number of manufactured faulty chips included in the chips without defect (5 chips) which are randomly extracted out of all the chips (135 chips) should be the number N2 of faulty chips without defect (2 chips) or less.

Like the random probability of failure P(N4), these Q(N3), P(N1) and Q(N2) can be obtained as {1−NOT·Q(N3)}, {1−NOT·P(N1)} and {1−NOT·Q(N2)}, respectively, after calculating the respective probabilities of complementary events (NOT·Q(N3)), (NOT·P(N1)) and (NOT·Q(N2)).

<Application to Program>

It is possible to describe at least part of the method of verifying the chip classification data in accordance with the first and seventh preferred embodiments (the flow shown in FIGS. 1 and 15 (except the steps S1 to S3 of FIG. 22 used in the steps S11 and S71)), at least part of the defect analysis method in accordance with the second to sixth preferred embodiments (the flow shown in FIGS. 3 and 4 (except the steps S1 to S3 of FIG. 22 used in the steps S21 and S31) and the steps S44 to S48 of FIG. 6 and the flow shown in FIGS. 9 and 11 (except the processing corresponding to the steps S41 to S43 of FIG. 6)) as a computer-executable program (computer-implemented method). For example, the computer-executable program is stored on a compute readable recording program.

Therefore, by executing the above program with a computer, the processing of verifying the chip classification data or the defect analysis processing in the above-discussed preferred embodiments can be automatically performed and it thereby becomes possible to considerably reduce the labor in the verification or the analysis.

While the invention has been shown and described in detail, the foregoing description is in all aspects illustrative and not restrictive. It is therefore understood that numerous modifications and variations can be devised without departing from the scope of the invention.

What is claimed is:

1. A computer-implemented method of defect analysis for a device in which an integrated circuit is formed on each of a plurality of chips on a wafer through a plurality of process steps, comprising the steps of:

(a) detecting defects after performing at least one of said plurality of process steps;

(b) judging pass/fail of said integrated circuit of each of said plurality of chips after said plurality of process steps;

(c) judging presence/absence of any of said defects which satisfies a predetermined discriminating condition on each of said plurality of chips in every said at least one process step;

(d) obtaining chip classification data in which said plurality of chips are classified into four sorts on the basis of combination of a judgment result of said step (b) and that of said step (c) in every said at least one process step;

(e) calculating the random probability of failure which is a probability that faulty chips not less than the corresponding number of faulty chips with defect should be included in chips of the corresponding number of defective chips which are randomly extracted out of said plurality of chips on the basis of said chip classification data, said corresponding number of defective chips being equal to the number of chips which are judged to have a defect in said step (c), said corresponding number of faulty chips with defect being equal to the number of chips which are judged to have a defect in said step (c) and judged to be failed in said step (b); and (f) judging adoption/rejection of said chip classification data on the basis of said random probability of failure and performing a defect analysis processing on the basis of said chip classification data if adopted, to output an analysis result.

2. The computer-implemented method according to claim 1, wherein said step (f) includes the steps of:
  (f-1) judging whether said random probability of failure is not less than a predetermined adoption reference value or not by YES or NO;
  (f-2) rejecting said chip classification data and canceling said defect analysis processing when YES in said step (f-1); and
  (f-3) performing said defect analysis processing on the basis of said chip classification data to output said analysis result when NO in said step (f-1).

3. The computer-implemented method according to claim 1, wherein said step (f) includes the steps of:
  (f-1) performing said defect analysis processing on the basis of said chip classification data to obtain a tentative analysis result;
  (f-2) judging whether said random probability of failure is not less than a predetermined adoption reference value or not by YES or NO;
  (f-3) rejecting said tentative analysis result when YES in said step (f-2); and
  (f-4) outputting said tentative analysis result as a true analysis result when NO in said step (f-2).

4. The computer-implemented method according to claim 1, wherein said step (c) is repeated a plurality of times with each of a plurality of detection sizes as a reference size, and said predetermined discriminating condition includes a detection size condition that each of said plurality of detection sizes should be not less than said reference size, said steps (d) and (e) are repeated said plurality of times, respectively, correspondingly to said step (c) which is repeated said plurality of times, and as a result, a plurality of partial chip classification data and a plurality of partial random probabilities of failure corresponding to said plurality of detection sizes are obtained as said chip classification data and said random probability of failure in said at least one process step, and said step (f) includes the step of:
  judging adoption/rejection of said plurality of partial chip classification data on the basis of said plurality of partial random probabilities of failure, respectively, and performing said defect analysis processing on the basis of only adopted ones out of said plurality of partial chip classification data, to output said analysis result.

5. The computer-implemented method according to claim 4, wherein said step (f) includes the steps of:
  (f-1) determining an adoption reference value;
  (f-2) judging adoption/rejection of said plurality of partial chip classification data on the basis of said plurality of partial random probabilities of failure, respectively, and said adoption reference value; and
  (f-3) performing said defect analysis processing on the basis of only ones of said plurality of partial chip classification data adopted in said step (f-2), to output said analysis result.

6. The computer-implemented method according to claim 5, wherein said step (f-3) includes said steps of:
  (f-3-1) calculating the number of process faulty chips which are estimated to be failed in said at least one process step in each of said adopted ones out of said plurality of partial chip classification data; and
  (f-3-2) calculating an optimum sensitivity detection size which is the detection size of one of said plurality of adopted partial chip classification data of which the number of process faulty chips takes the maximum value, to display it visibly.

7. The computer-implemented method according to claim 5, wherein said step (f) further includes the step of:
  (f-4) performing a tentative defect analysis processing on the basis of said plurality of partial chip classification data to visibly display a tentative analysis result together with said pluralities of partial random probability of failure, said step (f-4) being executed before said step (f-1).

8. The computer-implemented method according to claim 1, wherein said defects include a new defect caused by said at least one process step on a new region of said wafer other than a defect neighborhood region developed in a process step precedent to said at least one process step.

9. The computer-implemented method according to claim 1, wherein said step (e) includes the step of:
  calculating said random probability of failure by summing up the respective probabilities that faulty chips in the respective numbers from said corresponding number of faulty chips with defect to said corresponding number of defective chips should be present in randomly-extracted chips of said corresponding number of defective chips.

10. The computer-implemented method according to claim 1, wherein said step (e) includes the step of:
calculating said random probability of failure on the basis of the probability of complementary event of said random probability of failure, said probability of complementary event being obtained by summing up the respective probabilities that faulty chips in the respective numbers from "0" to a number obtained by subtracting "1" from said corresponding number of faulty chips with defect should be present in randomly-extracted chips of said corresponding number of defective chips.

11. The computer-implemented method according to claim 1, wherein said step (c) is repeated a plurality of times with each of a plurality of detection sizes as a reference size, and said predetermined discriminating condition includes a detection size condition that each of said plurality of detection sizes should be not less than said reference size, and said steps (d) and (e) are repeated said plurality of times, respectively, correspondingly to said step (c) which is repeated said plurality of times, and as a result, a plurality of partial chip classification data and a plurality of partial random probabilities of failure corresponding to said plurality of detection sizes are obtained as said chip classification data and said random probability of failure in said at least one process step.

12. The computer-implemented method according to claim 1, wherein said defects include a new defect caused by said at least one process step on a new region of said wafer other than a defect neighborhood region developed in a process step precedent to said at least one process step.

* * * * *